US011169192B2

(12) United States Patent
Underwood (10) Patent No.: US 11,169,192 B2
(45) Date of Patent: Nov. 9, 2021

(54) TRIGONOMETRY DEPENDENT PLOT CREATION

(71) Applicant: The Government of the United States, as represented by the Secretary of the Army, Washington, DC (US)

(72) Inventor: Brandon Underwood, Brick, NJ (US)

(73) Assignee: The Government of the United States, as represented by the Secretary of the Army, Washington, DC (US)

( * ) Notice: Subject to any disclaimer, the term of this patent is extended or adjusted under 35 U.S.C. 154(b) by 301 days.

(21) Appl. No.: 16/390,030

(22) Filed: Apr. 22, 2019

(65) Prior Publication Data

US 2019/0324072 A1   Oct. 24, 2019

Related U.S. Application Data

(60) Provisional application No. 62/661,334, filed on Apr. 23, 2018.

(51) Int. Cl.
| | | |
|---|---|---|
| *G01R 27/14* | (2006.01) | |
| *G06T 11/20* | (2006.01) | |
| *G06F 17/11* | (2006.01) | |
| *G01R 27/06* | (2006.01) | |

(52) U.S. Cl.
CPC ............ *G01R 27/14* (2013.01); *G01R 27/06* (2013.01); *G06F 17/11* (2013.01); *G06T 11/206* (2013.01)

(58) Field of Classification Search
CPC ........ G01R 27/14; G01R 27/06; G01R 27/02; G06F 17/11; G06T 11/20; G06T 11/206; G01B 7/105; G05B 19/41; B29C 48/395; H02J 5/005
See application file for complete search history.

(56) References Cited

U.S. PATENT DOCUMENTS

| | | | | |
|---|---|---|---|---|
| 5,568,499 A | * | 10/1996 | Lear | .................... H01S 5/18313 |
| | | | | 257/21 |
| 9,310,328 B1 | * | 4/2016 | Abdalla | ........... G01N 33/57426 |
| 9,966,168 B1 | * | 5/2018 | Kuo | ...................... D06M 11/01 |
| 2012/0218521 A1 | * | 8/2012 | Dobashi | ............... A61B 3/0075 |
| | | | | 351/245 |
| 2017/0307554 A1 | * | 10/2017 | Emerson | .............. C25D 17/005 |

FOREIGN PATENT DOCUMENTS

| | | | | | |
|---|---|---|---|---|---|
| CN | 101180591 | * | 5/2008 | ............. | G05B 19/41 |
| CN | 105553122 | * | 5/2016 | ............. | H02J 5/005 |
| WO | WO 2005038391 | * | 4/2005 | ............. | G01B 7/105 |
| WO | WO 2009152974 | * | 12/2009 | ........... | B29C 48/395 |

* cited by examiner

*Primary Examiner* — Tung S Lau
(74) *Attorney, Agent, or Firm* — Ronald Krosky (57) ABSTRACT

In various embodiments, a graphical plotter can create a transformation circle. An identification component can identify a center point, a radius from the center point, and a circular outer point set extended from the center point by the radius. A creation component can create a plot based, at least in part, on the center point, the radius, and the circular outer point set. An output component can cause the plot to be outputted, where the circular outer point set is dependent on trigonometry of an angle set from an x-axis pertaining to the center point and the radius.

10 Claims, 9 Drawing Sheets

TRIGONOMETRY DEPENDENT PLOT CREATION

CROSS-REFERENCE

This application is a non-provisional patent application that claims priority to U.S. Application No. 62/661,334 filed on Apr. 23, 2018. U.S. Application No. 62/661,334 is hereby incorporated by reference.

GOVERNMENT INTEREST

The innovation described herein may be manufactured, used, imported, sold, and licensed by or for the Government of the United States of America without the payment of any royalty thereon or therefore.

BACKGROUND

Based on different communication needs, different electrical circuits can be employed. In one example, a matching circuit bridges an antenna to a source electrical circuit. This can allow the source electrical circuit to provide power to the antenna and therefore allow the antenna to function. Gathering information about the antenna can be beneficial.

SUMMARY

In one embodiment, a method is performed at least in part by a graphical plotter. The method can comprise identifying a center point, a radius from the center point, and a circular outer point set extended from the center point by the radius. The method can also comprise creating a plot based, at least in part, on the center point, the radius, and the circular outer point set and causing the plot to be outputted, where the circular outer point set is dependent on trigonometry of an angle set from an x-axis pertaining to the center point and the radius.

In another embodiment, a visualization apparatus, that comprises a processor and a non-transitory computer-readable medium, can be configured to perform a method. The method can comprise computing a resistance and a reactance of an electrical circuit. The method can also comprise defining a center point with an x-axis value of the resistance and a y-axis value of the reactance. The method can further comprise identifying a radius from the center point and a circular outer point set extended from the center point by the radius. The method can additionally comprise creating a transformation circle based, at least in part, on the center point, the radius, and the circular outer point set as well as causing the transformation circle to be outputted, where the circular outer point set is dependent on trigonometry of an angle set from an x-axis pertaining to the center point and the radius.

In yet another embodiment, a non-transitory computer-readable medium, operatively coupled to a processor, can be configured to store processor-executable instructions that when executed by the processor, cause the processor to perform a method. The method can comprise selecting a center point and determining a radius from the center point. The method can also comprise choosing an angle difference and defining a circular outer point set extended from the center point by the radius by employment of the angle difference. The method can additionally comprise producing a plot based, at least in part, on the center point, the radius, and the circular outer point set and outputting the plot onto a display, where the circular outer point set is dependent on trigonometry of an angle set, derived from the angle difference, from an x-axis pertaining to the center point and the radius.

BRIEF DESCRIPTION OF THE DRAWINGS

Incorporated herein are drawings that constitute a part of the specification and illustrate embodiments of the detailed description. The detailed description will now be described further with reference to the accompanying drawings as follows.

DETAILED DESCRIPTION

A component can identify resistance and reactance for an electrical circuit. This resistance and reactance can be the basis for a center point of a plot. A circle can be drawn around this center point based on trigonometry of the resistance and reactance. A display can present this circle as the plot.

With this, a transformation circle can be plotted to characterize complex impedance conversions or transformations. This can cover real and imaginary aspects over a broad area of the Resistance-Reactance plane. By contrast to a Single Frequency Impedance Conversion method that transforms a single point on the R-X plane to a position of desired Standing Wave Ratio, a Transformation Circle method can provide an manner of transforming a range of impedance values enclosed within a Transformation Circle Region to a Definition Circle Region of a selected Maximum Standing Wave Ratio value.

The following includes definitions of selected terms employed herein. The definitions include various examples. The examples are not intended to be limiting.

"One embodiment", "an embodiment", "one example", "an example", and so on, indicate that the embodiment(s) or example(s) can include a particular feature, structure, characteristic, property, or element, but that not every embodiment or example necessarily includes that particular feature, structure, characteristic, property or element. Furthermore, repeated use of the phrase "in one embodiment" may or may not refer to the same embodiment.

"Computer-readable medium", as used herein, refers to a medium that stores signals, instructions and/or data. Examples of a computer-readable medium include, but are not limited to, non-volatile media and volatile media. Non-volatile media may include, for example, optical disks, magnetic disks, and so on. Volatile media may include, for example, semiconductor memories, dynamic memory, and so on. Common forms of a computer-readable medium may include, but are not limited to, a floppy disk, a flexible disk, a hard disk, a magnetic tape, other magnetic medium, other optical medium, a Random Access Memory (RAM), a Read-Only Memory (ROM), a memory chip or card, a memory stick, and other media from which a computer, a processor or other electronic device can read. In one embodiment, the computer-readable medium is a non-transitory computer-readable medium.

"Component", as used herein, includes but is not limited to hardware, firmware, software stored on a computer-readable medium or in execution on a machine, and/or combinations of each to perform a function(s) or an action(s), and/or to cause a function or action from another component, method, and/or system. Component may include a software controlled microprocessor, a discrete component, an analog circuit, a digital circuit, a programmed logic device, a memory device containing instructions, and so on. Where multiple components are described, it may be possible to incorporate the multiple components into one physical component or conversely, where a single component is described, it may be possible to distribute that single component between multiple components.

"Software", as used herein, includes but is not limited to, one or more executable instructions stored on a computer-readable medium that cause a computer, processor, or other electronic device to perform functions, actions and/or behave in a desired manner. The instructions may be embodied in various forms including routines, algorithms, modules, methods, threads, and/or programs including separate applications or code from dynamically linked libraries.

Figure 1:
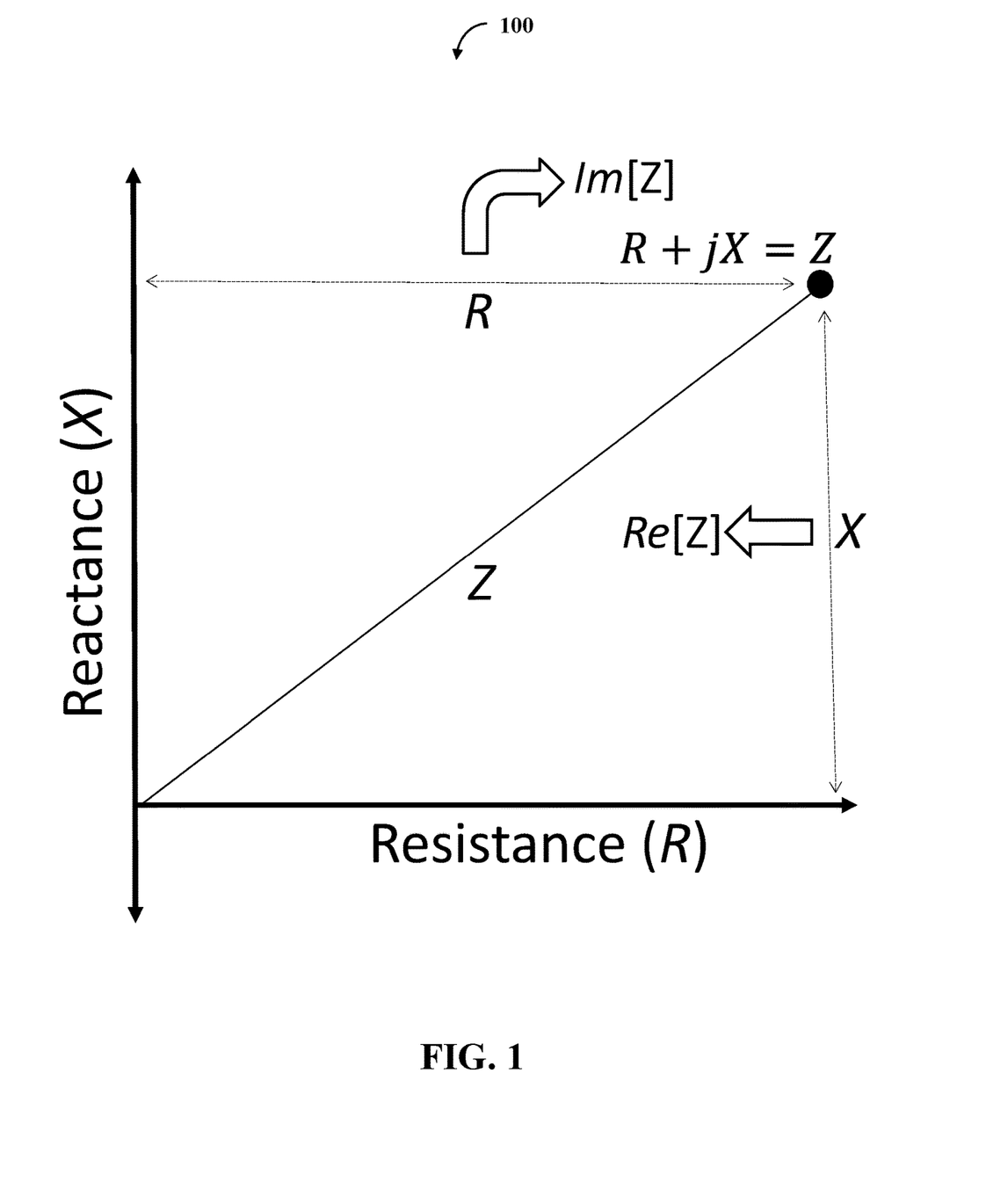
FIG. 1 illustrates one embodiment of a first graph.

FIG. 1 illustrates one embodiment of a first graph 100. Complex Impedance curves in Radio Frequency (RF) systems upon which Impedance Matching is to be performed can be plotted on the Resistance vs. Reactance (R-X) Complex Impedance Plane—the plane of the first graph 100. Complex impedance (Z) can be expressed as:

$$R + jX = Z \tag{1}$$

and plotted by way of example in the R-X plane as illustrated in FIG. 1, where R=Resistance (Real Component); X=Reactance (Imaginary Component); and Z is the vector sum of R and X. Units for the impedance component values are in ohms ($\Omega$). The Real Resistance Component R can be reliant on circumstances be hereinafter expressed as $Z_0$ or $Z'_0$.

Figure 2:
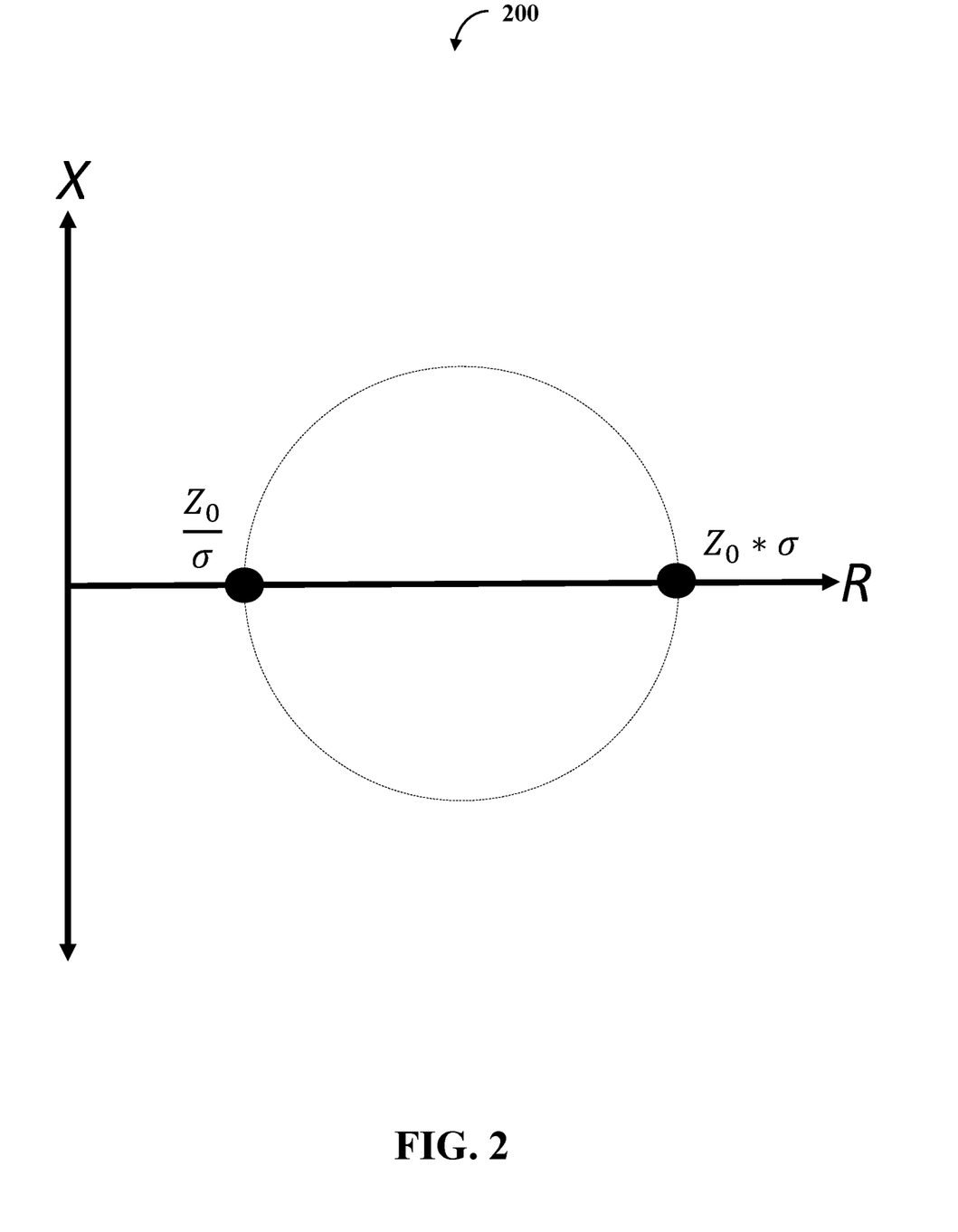
FIG. 2 illustrates one embodiment of a second graph.

FIG. 2 illustrates one embodiment of a second graph 200. Circles of constant Reflection Coefficient value ($\rho$) can be a function of Standing Wave Ratio ($\sigma$) and can be plotted on the R-X Plane as in the second graph 200. This can be where minimum and maximum p are expressed as $Z_0/\sigma$ and $Z_0*\alpha$ respectively. The term $Z_o$ can comprise a desired Impedance Value (e.g. a Source Impedance) to which a system being matched.

A Definition Circle can be a circle of constant Reflection Coefficient ($\rho$) and Standing Wave Ratio ($\alpha$). This is illustrated in the second graph 200. The constant $\rho$ and a values of the circle can be maximum values desired for a system upon which one is performing impedance matching.

Figure 3:
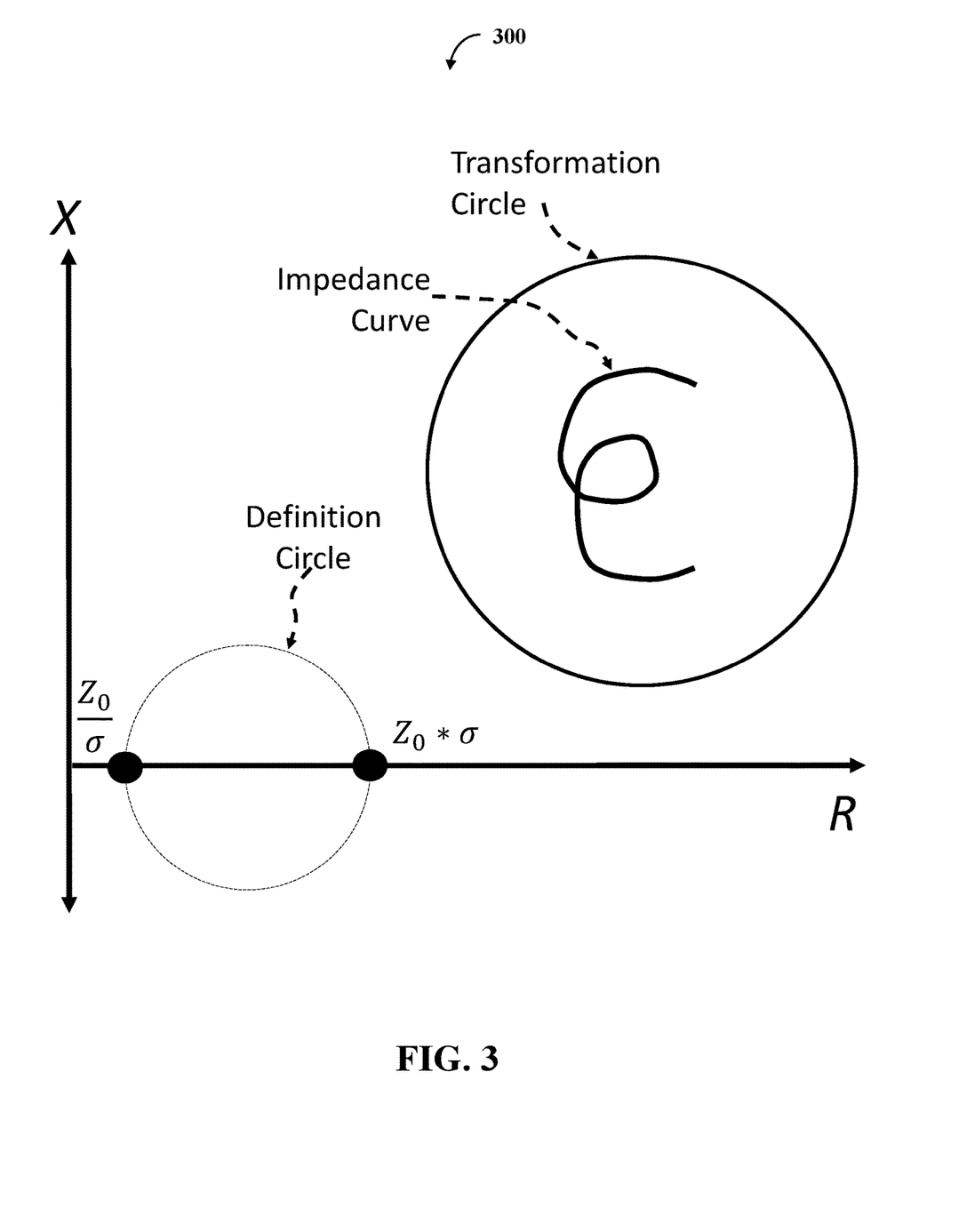
FIG. 3 illustrates one embodiment of a third graph.

FIG. 3 illustrates one embodiment of a third graph 300. The third graph 300 shows a circular region known as a Transformation Circle on the R-X plane. The Transformation Circle can be defined such that an Impedance Curve contained within the Transformation Circle can be transformed (moved) by way of an impedance matching operation characterized by the Transformation Circle. In one example, this can be done to within a specified Definition Circle of which the Transformation Circle is a function, such that the new Reflection Coefficient $\rho$ and Standing Wave Ratio $\sigma$ values of the transformed Impedance Curve will be at or below the maximum $\rho$ and $\sigma$ values characterized by the Definition Circle.

In one embodiment, a Definition Circle is described according to the equation:

$$(R_L - C_1)^2 + (X_L - C_2)^2 = C_3^2 \tag{2}$$

where the terms $R_L$ and $X_L$ define the set of Load Impedance elements enclosed by the Transformation Circle that can be transformed to the Definition Circle. The $C_1$ and $C_2$ terms can be a function of the Definition Circle and respectively can define the Resistance against Reactance Center Point of a Transformation Circle on the R-X Plane. The $C_3$ term (e.g., also a function of the Definition Circle) can define the radius of the Transformation Circle. The form of $C_1$, $C_2$ and $C_3$ terms can vary for the different types of Impedance Transformations being performed. Example Impedance Transformations can include Line, Series (e.g., a Series Short Circuit Element or a Series Open Circuit Element), and Parallel (e.g., a Parallel Short Circuit Element or a Parallel Open Circuit Element).

A Line Transform can be an Impedance Transformation Method that changes the Real value of the input impedance ($Z_{in}$) of a system. In various embodiments, a Line Transform is implemented by placing a Distributed Impedance Element having a Real impedance component $Z'_0$ and electrical length $\theta$, in line between a Source Impedance $Z_0$ and Load Impedance $Z_L$, where $Z_0 \neq Z'_0$.

A Line Transform Circle Characteristic Equation can be expressed by $$\left[ R_L - \frac{a(1 + \tan^2\theta)}{1 + \frac{a^2 - b^2}{(Z'_o)^2}\tan^2\theta} \right]^2 + \left[ X_L - \frac{Z'_o\tan\theta\left(\frac{a^2 - b^2}{(Z'_0)^2} - 1\right)}{1 + \frac{a^2 - b^2}{(Z'_o)^2}\tan^2\theta} \right]^2 = \left[ \frac{b(1 + \tan^2\theta)}{1 + \frac{a^2 - b^2}{(Z'_o)^2}\tan^2\theta} \right]^2 \tag{3}$$

where the center of the Line Transformation Circle on the R-X Plane is defined by the points $$R = \frac{a(1 + \tan^2\theta)}{1 + \frac{a^2 - b^2}{(Z'_o)^2}\tan^2\theta} \text{ and} \tag{4}$$

$$X = \frac{Z'_o\tan\theta\left(\frac{a^2 - b^2}{(Z'_0)^2} - 1\right)}{1 + \frac{a^2 - b^2}{(Z'_o)^2}\tan^2\theta} \tag{5}$$

The radius (r) of the Line Transformation Circle can be expressed as $$\frac{b(1 + \tan^2\theta)}{1 + \frac{a^2 - b^2}{(Z'_o)^2}\tan^2\theta} \tag{6}$$

Within the Line Transformation circle, the following can apply $$a = \frac{Z_o}{2}\left(\sigma + \frac{1}{\sigma}\right) \text{ and} \tag{7}$$

$$b = \frac{Z_o}{2}\left(\sigma - \frac{1}{\sigma}\right) \tag{8}$$

A Series Transform can be an impedance matching network that is implemented by placing a Distributed Impedance Element in series on a conduction path between a source and load, where the Reactive (X) Component of the Impedance is transformed. A Series Transformation Circle Characteristic Equation can be expressed as $$(R_L - a)^2 + (X_L + X_s)^2 = b^2 \tag{9}$$

where the center of the Series Transformation Circle on the R-X Plane can be defined by the points:

$$R = a \tag{10}$$

and $$X = -X_s \tag{11}$$

The $X_s$ term can denote the Reactance Value of the Center Point for a Series Transformation Circle. A series transformation can be accomplished with a Short Circuited Series Matching Element or an Open Circuited Series Matching element. The $X_s$ term (and thereby the Series Transformation Circle Center Point) can be different in different instances.

For a Short Circuited Series Transformation Line, $$X_s = Z'_o \tan\theta \tag{12}$$

and for an Open Circuited Series Transformation Line, $$X_s = -Z'_o \cot\theta \tag{13}$$

The radius (r) of the circle can be expressed by the variable 'b'.

A Parallel Transform can be an impedance matching network that is implemented by placing a Distributed Impedance Element in parallel with a load, where the Resistive (R) and Reactive (X) Component of the Impedance are transformed. A Parallel Transform Circle Characteristic equation can be expressed as $$\left[R_L - \frac{a}{1 + \left(\frac{Z_0}{X_P}\right)^2}\right]^2 + \left[X_L - \frac{\frac{Z_0^2}{X_P}}{1 + \left(\frac{Z_0}{X_P}\right)^2}\right]^2 = \left[\frac{b}{1 + \left(\frac{Z_0}{X_P}\right)^2}\right]^2 \tag{14}$$

The center of the Parallel Transformation Circle on the R-X Plane can defined by the points $$R = \frac{a}{1 + \left(\frac{Z_0}{X_P}\right)^2} \text{ and} \tag{15}$$

$$X_L = \frac{\frac{Z_0^2}{X_P}}{1 + \left(\frac{Z_0}{X_P}\right)^2} \tag{16}$$

As with the Series Transformation Circle, the $X_P$ term can denote the Reactance Value of the Center Point for a Parallel Transformation Circle, where a Parallel Transformation can also be accomplished with either a Short Circuited Parallel Matching Element or an Open Circuited Parallel Matching element, with a different $X_P$ value for the different cases. For a Short Circuited Parallel Transformation Line, this can be $$X_P = Z'_o \tan\theta \tag{17}$$

For an Open Circuited Parallel Transformation Line, this can be $$X_P = -Z'_o \cot\theta \tag{18}$$

The radius of the Parallel Transformation Circuit can be expressed as $$\frac{b}{1 + \left(\frac{Z_0}{X_P}\right)^2} \tag{19}$$

Figure 4:
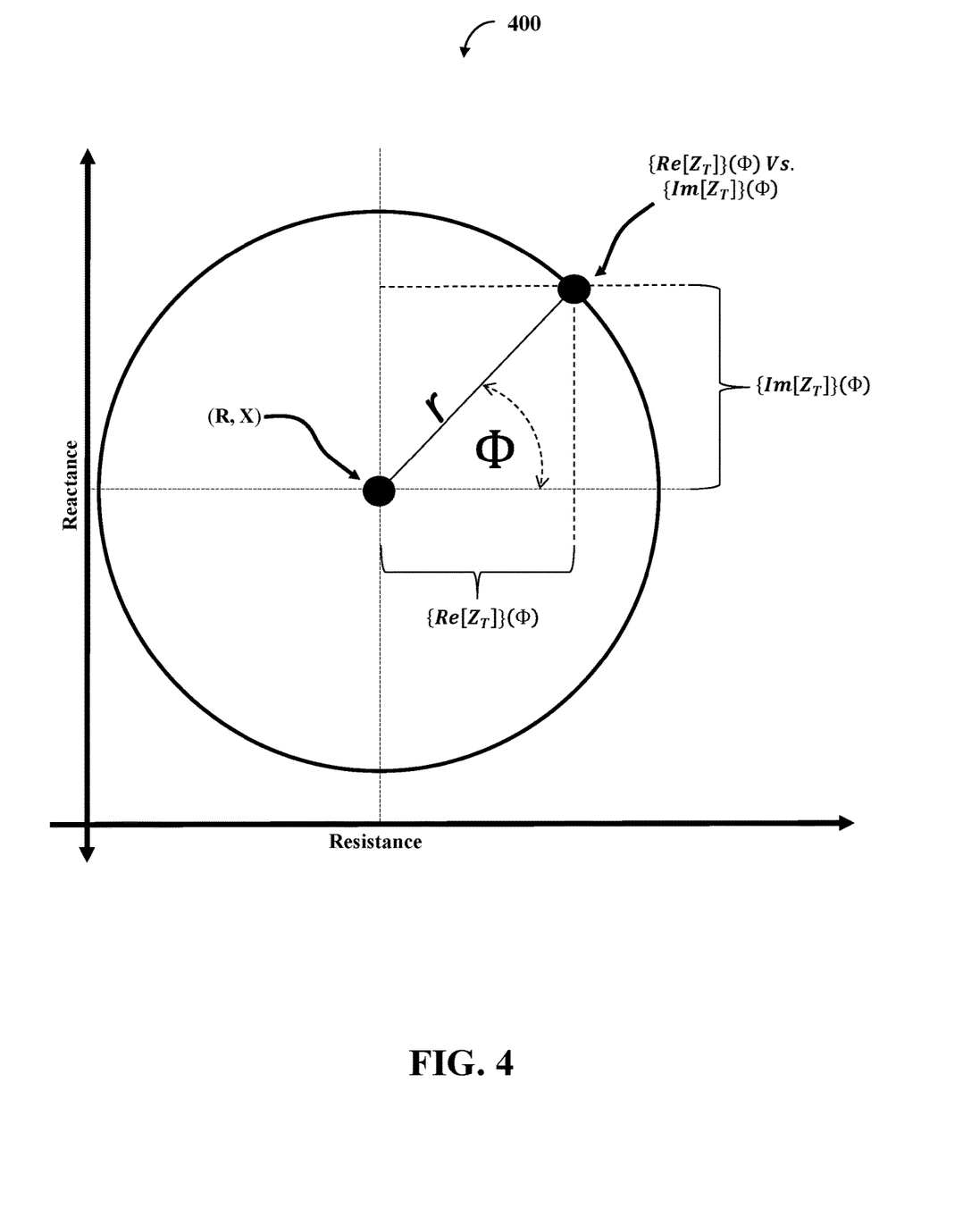
FIG. 4 illustrates one embodiment of a fourth graph.

FIG. 4 illustrates one embodiment of a fourth graph 400. With the fourth graph 400 a Transformation Circle may be defined about a center point (R, X) in the R-X Plane. A point on the circumference of the Transformation Circle can be defined as $Z_T$. Points $Z_T$ about the Transformation Circle can be a function of an Angle Φ. A Real or Resistive Component of a point $Z_T$ can be be expressed as Re[$Z_T$] and an Imaginary or Reactive Component of a point $Z_T$ may be expressed as Im[$Z_T$]. These can be characterized as:

$$\{\text{Re}[Z_T]\}(\Phi) = r^*\cos(\Phi) + R \tag{20}$$

and $$\{\text{Im}[Z_T]\}(\Phi) = r^*\sin(\Phi) + X \tag{21}$$

The fourth graph 400 depicts a concept of a Transformation Circle plotted per equations 20 and 21 according to one embodiment, with Resistive and Reactive Components Re[$Z_T$] and Im[$Z_T$] components of Points $Z_T$ plotted in a full circle with Φ spanning from 0 to 360 degrees.

Through equation substitution for r, R and X into the preceding {Re[Z]}(Φ) and {Re[Z]}(Φ) equations, different outcomes can be available. For a Line Transform this can lead to $$\{\text{Re}[Z_T]\}(\Phi) = \frac{b(1 + \tan^2\theta)}{1 + \frac{a^2 - b^2}{(Z'_o)^2}\tan^2\theta} * \cos(\Phi) + \frac{a(1 + \tan^2\theta)}{1 + \frac{a^2 - b^2}{(Z'_o)^2}\tan^2\theta} \tag{22}$$

$$\{\text{Im}[Z_T]\}(\Phi) = j * \frac{b(1 + \tan^2\theta)}{1 + \frac{a^2 - b^2}{(Z'_o)^2}\tan^2\theta} * \sin(\Phi) + \frac{Z'_o\tan\theta\left(\frac{a^2 - b^2}{(Z'_0)^2} - 1\right)}{1 + \frac{a^2 - b^2}{(Z'_o)^2}\tan^2\theta} \tag{23}$$

For a Series Transform with a Short Circuited Reactive Element this can lead to $$\text{Re}[Z_T](\Phi) = b^*\cos(\Phi) + a \tag{24}$$

and $$\text{Im}[Z_T](\Phi) = b^*\sin(\Phi) + Z'_o \tan\theta \tag{25}$$

For a Series Transform with an Open Circuited Reactive Element this can lead to $$\text{Re}[Z_T](\Phi) = b^*\cos(\Phi) + a \tag{26}$$

and $$\text{Im}[Z_T](\Phi) = j^*b^*\sin(\Phi) - Z'_o \cot\theta \tag{27}$$

For a Parallel Transform with a Short Circuited Reactive Element this can lead to $$\text{Re}[Z_T](\Phi) = \frac{b}{1+\left(\frac{Z_0}{Z'_o\tan\theta}\right)^2}*\cos(\theta) + \frac{a}{1+\left(\frac{Z_0}{Z'_o\tan\theta}\right)^2} \text{ and} \quad (28)$$

$$\text{Im}[Z_T](\Phi) = \frac{b}{1+\left(\frac{Z_0}{Z'_o\tan\theta}\right)^2}*\sin(\theta) + \frac{\frac{Z_0^2}{Z'_o\tan\theta}}{1+\left(\frac{Z_0}{Z'_o\tan\theta}\right)^2} \quad (29)$$

For a Parallel Transform with an Open Circuited Reactive Element this can lead to $$\text{Re}[Z_T](\Phi) = \frac{b}{1-\left(\frac{Z_0}{Z'_o\cot\theta}\right)^2}*\cos(\theta) + \frac{a}{1-\left(\frac{Z_0}{Z'_o\cot\theta}\right)^2} \text{ and} \quad (30)$$

$$\text{Im}[Z_T](\Phi) = \frac{b}{1-\left(\frac{Z_0}{Z'_o\cot\theta}\right)^2}*\sin(\theta) - \frac{\frac{Z_0^2}{Z'_o\cot\theta}}{1-\left(\frac{Z_0}{Z'_o\cot\theta}\right)^2} \quad (31)$$

Figure 5:
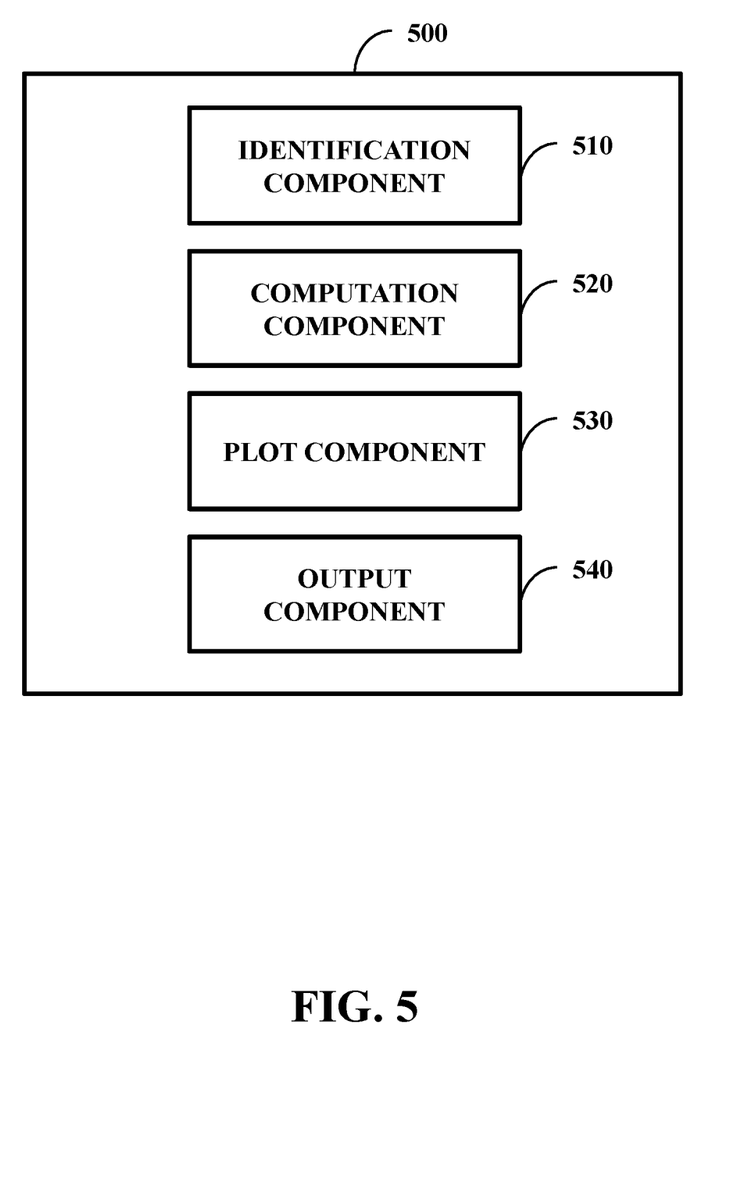
FIG. 5 illustrates one embodiment of a system comprising a computation component, an identification component, a plot component, and an output component.

FIG. 5 illustrates one embodiment of a system 500 comprising a computation component 510, an identification component 520, a plot component 530, and an output component 540. In one embodiment, the system 500 can be a graphical plotter (e.g., an impedance analyzer, a network analyzer, or a computing device) and the components 510-540 can perform different functionality. For example, the graphical plotter can create a plot as a transformation circle for an electrical circuit.

The identification component 510 can be configured to identify base metrics for the transformation circle. Example metrics can include the center point, the radius from the center point, and the circular outer point set extended from the center point by the radius. In one embodiment, the center point can be identified as having an x-axis position based on a resistance of the electrical circuit and a y-axis position based on a reactance of the electrical circuit. From this center point, a circular outer point set can be defined (e.g., by the computation component 520).

The computation component 520 can be configured to perform various computations that pertain to creating the plot, such as the transformation circle illustrated in the graph 400 of FIG. 4. In one example, the computation component 520 can determine the plot should be created with eight circular outer points (although more or less can be used). Therefore, eight reference angles can be employed: 45°, 90°, 135°, 180°, 225°, 270°, 315°, and 360°/0°.

The computation component 520 can perform eight iterations; one iteration for each of the eight angles. The computation component 520 can select the first reference angle of the angle set (e.g., 45°), take the cosine of the first reference angle for a first cosine result, multiply the first cosine result by the radius for a first cosine radius result, add the resistance to the first cosine radius result to produce an x-axis value for a first point of the circular outer point set. The computation component 520 can also take the sine of the first reference angle for a first sine result, multiply the first sine result by the radius for a first sine radius result, and add the reactance to the first sine radius result to produce a y-axis value for the first point of the circular outer point set.

This can result in the x-y location of the first point. This can continue for the remaining seven reference angles to produce x-y locations for eight points.

The plot component 530 can be configured to create the transformation circle based, at least in part, on the center point, the radius, and the circular outer point set. As examples, the transformation circle can be a line transformation circle, a parallel transformation circle, or a series transformation circle depending on characteristics of the electrical circuit. The plot component can perform other plotting, such as plotting of the impedance curve as illustrated in the graph 300 of FIG. 3.

The output component 540 can be configured to cause an output of the plot. In one example, the graphical plotter can comprise a monitor and the output component 540 can cause the monitor to display the plot.

Figure 6:
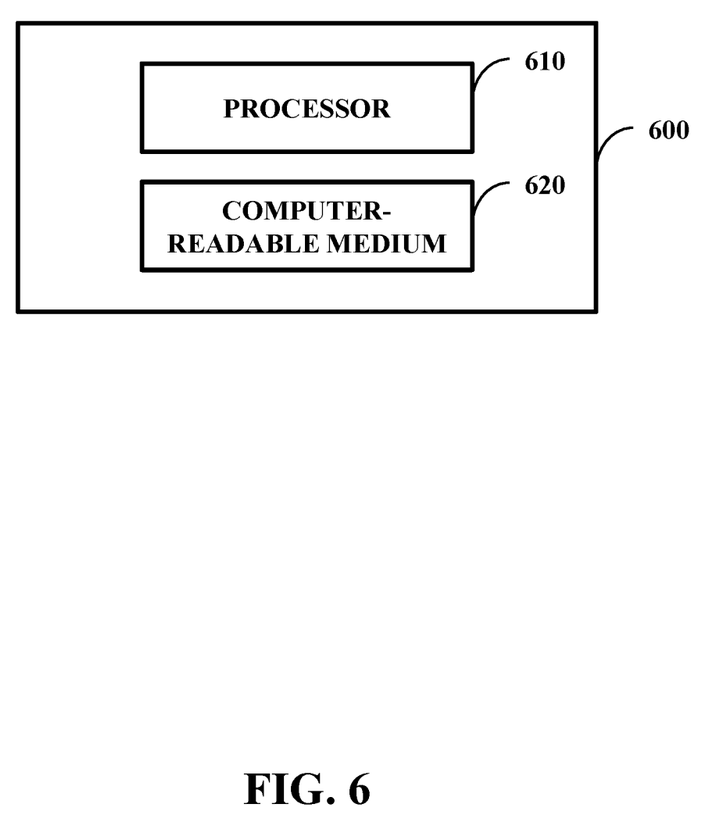
FIG. 6 illustrates one embodiment of a system comprising a processor and a non-transitory computer-readable medium.

FIG. 6 illustrates one embodiment of a system 600 comprising a processor 610 and a non-transitory computer-readable medium 620. The system 600 can implement as at least part of a visualization apparatus that comprises the processor 610 and the non-transitory computer-readable medium 620. In one embodiment the non-transitory computer-readable medium 620 is communicatively coupled to the processor 810 and stores a command set executable by the processor 610 to facilitate operation of at least one components disclosed herein (e.g., the computation component 510 of FIG. 5). In one embodiment, at least one component disclosed herein (e.g., the identification component of FIG. 5) can be implemented, at least in part, by way of non-software, such as implemented as hardware by way of the system 600. In one embodiment the non-transitory computer-readable medium 620 is configured to store processor-executable instructions that when executed by the processor 610 cause the processor 610 to perform a method disclosed herein (e.g., the method 700 and the method 800 discussed below).

Figure 7:
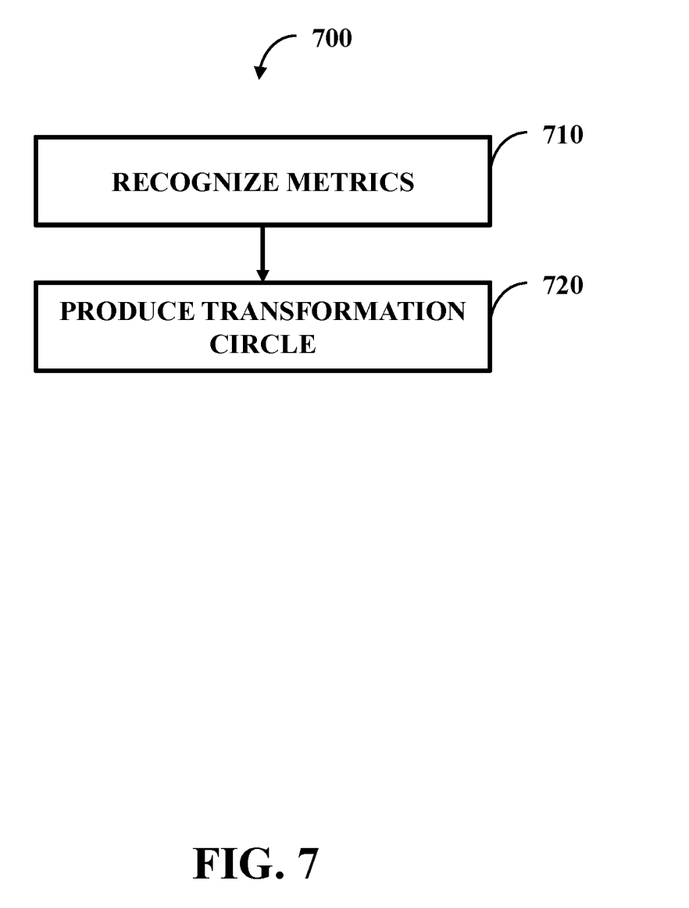
FIG. 7 illustrates one embodiment of a method comprising two actions.

FIG. 7 illustrates one embodiment of a method 700 comprising two actions 710-720. At 710, metrics can be recognized. The metrics can include a resistance of an electrical circuit, a reactance of the electrical circuit, a center point (e.g., with an x-axis value of the resistance and a y-axis value of the reactance), a radius from the center point, and a circular outer point set extended from the center point by the radius.

At 720, a transformation circle (e.g., line, series open circuited reactive element, series short circuited reactive element, parallel short circuited reactive element, or parallel open circuited reactive element) can be created based, at least in part, on the center point, the radius, and the circular outer point set. As part of this creation, a number of points can be selected for the circular outer point set (e.g., the number is pre-defined or determined by contextual factors). An angle difference can be determined based, at least in part, on the number of points in the circular outer point set and the transformation circle can be created based, at least in part, on the angle difference. As an example, if the number of points is thirty-six, then the angle difference can be ten (e.g., 360° divided by ten) and then points can be incremented by ten when creating the transformation circle. Once completed or while being completed the transformation circle can be outputted.

Figure 8:
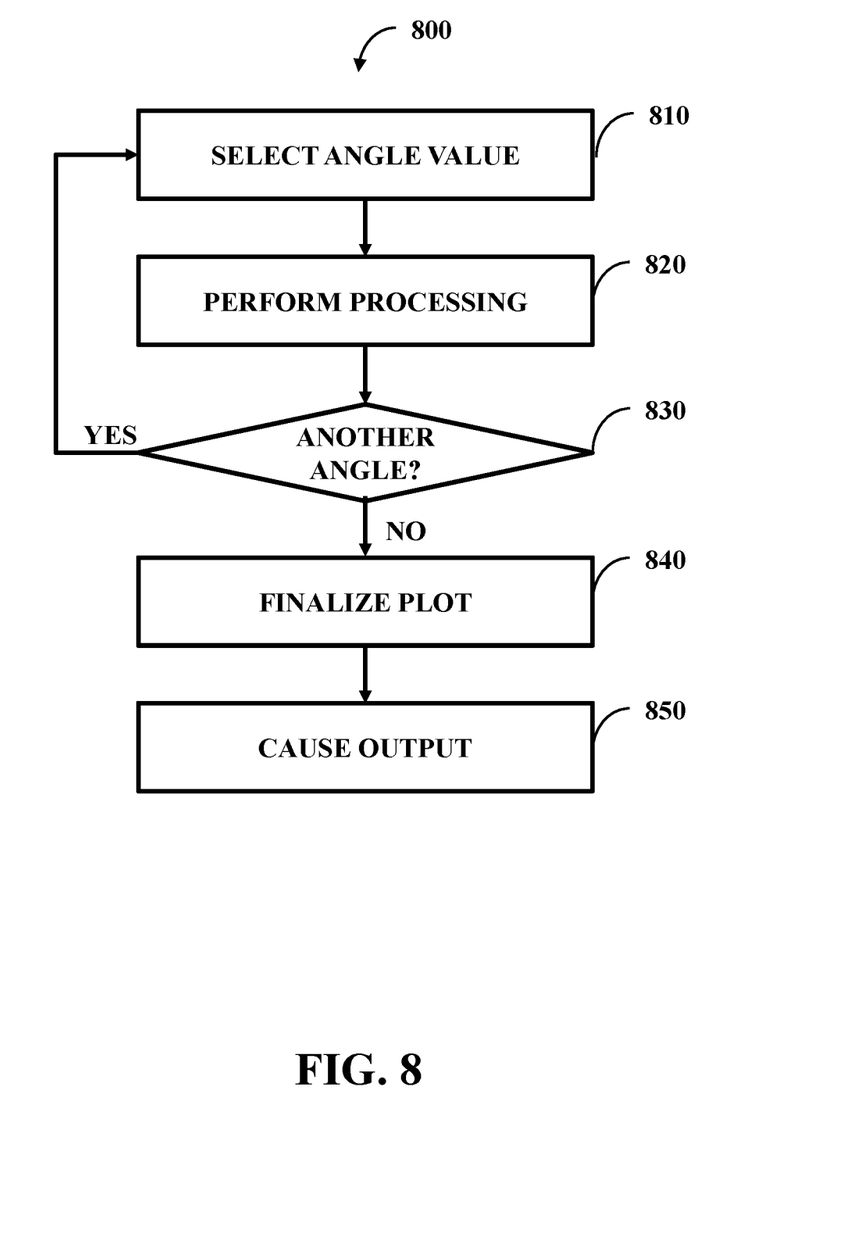
FIG. 8 illustrates one embodiment of a method comprising five actions.

FIG. 8 illustrates one embodiment of a method 800 comprising two actions 810-850. Four reference angle values can be determined for functioning with the method 800, such as four angle values defined for four points—90°, 180°, 270°, and 0°/360°—although the angles can be determined such that they are not evenly distributed. The first angle—

90°—can be selected at 810. At 820, processing can be performed, such as using equations 20 and 21 with the angle 90°. At 830, a check is performed to determine if there is another angle for processing—in the above example this would go to 180°, 270°, and 0°/360°. When another angle remains, then the method 800 can return to action 810 for selection and processing of the next angle.

When no more angles remain, the method 800 can continue to action 840 to finalize the plot. In one example, when the points are calculated from the angles, the curved lines can be drawn to create the circle. At 850, the plot can be caused to be outputted, such as sent as a file attachment, displayed on an impedance analyzer, network analyzer, outputted to a computer screen, or any medium/apparatus causing it to be visible and/or usable to a user, including within the context of an electromagnetic modelling and simulation computer program environment.

Figure 9:
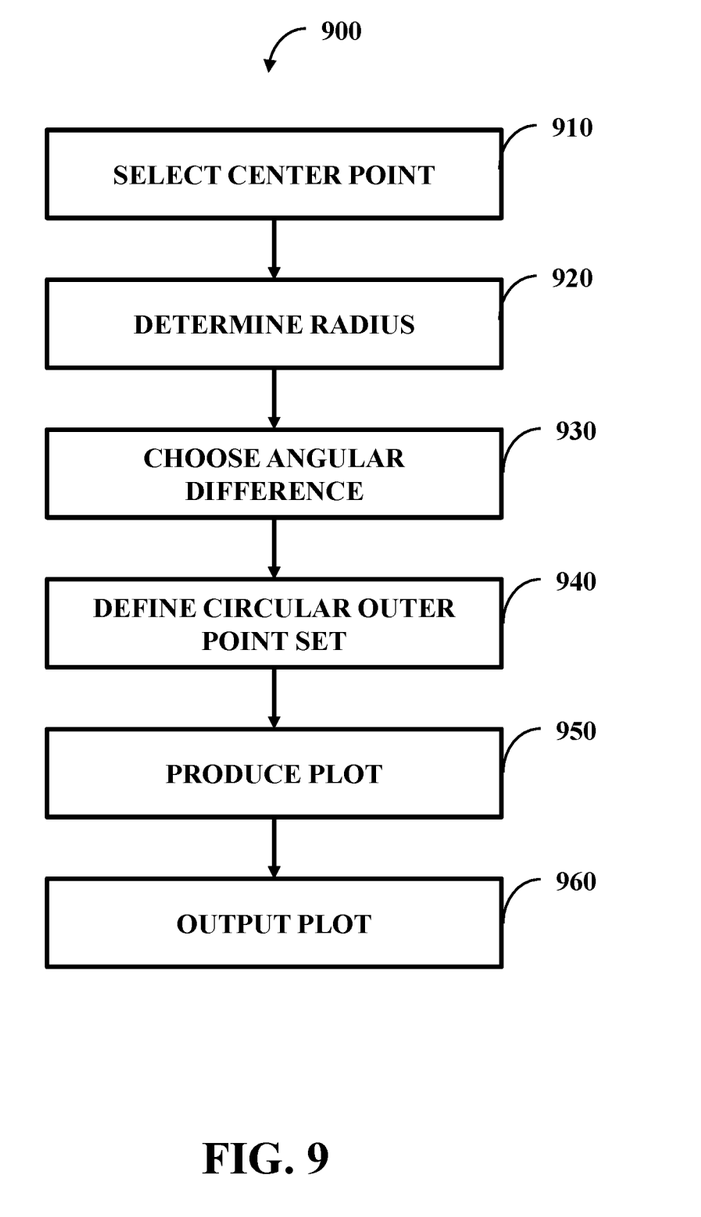
FIG. 9 illustrates one embodiment of a method comprising six actions.

FIG. 9 illustrates one embodiment of a method 900 comprising six actions 910-960. At 910, the center point can be selected. This selection can occur by measuring the resistance and reactance of an electric circuit and those values can serve as the center point (e.g., x-axis position is based on resistance and y-axis is based on reactance). At 920, the radius can be calculated and at 930 an angle difference can be selected.

With the radius and angle difference, various calculations can be made (e.g., with at least some equations disclosed herein) to determine the x-axis values and y-axis values such that at 940 there is a circular outer point set defined that extends from the center point by the radius by employment of the angle difference. With this, the circular outer point set can be dependent on trigonometry of an angle set, derived from the angle difference, from an x-axis pertaining to the center point and the radius. As the circular outer point set is defined, the points can be used at 950 to produce a plot. In this, the plot can be based, at least in part, on the center point, the radius, and the circular outer point set. At 960, the plot can be outputted onto a display.

What is claimed is:

1. A method, performed at least in part by graphical plotter, comprising:
   identifying a center point, the center point having an x-axis position based on a resistance of an electrical circuit and the center point having a y-axis position based on a reactance of the electrical circuit;
   identifying a radius from the center point
   identifying a circular outer point set extended from the center point by the radius, the circular outer point set being dependent on trigonometry of an angle set from an x-axis pertaining to the center point and the radius;
   creating a plot based, at least in part, on the center point, the radius, and the circular outer point set
   causing the plot to be outputted, the plot being a a transformation circle;
   selecting a first reference angle of the angle set;
   taking the cosine of the first reference angle for a first cosine result;
   multiplying the first cosine result by the radius for a first cosine radius result;
   adding the resistance to the first cosine radius result to produce an x-axis value for a first point of the circular outer point set;
   taking the sine of the first reference angle for a first sine result;
   multiplying the first sine result by the radius for a first sine radius result;
   adding the reactance to the first sine radius result to produce a y-axis value for the first point of the circular outer point set;
   selecting a second reference angle of the angle set;
   taking the cosine of the second reference angle for a second cosine result;
   multiplying the second cosine result by the radius for a second cosine radius result;
   adding the resistance to the second cosine radius result to produce an x-axis value for a second point of the circular outer point set;
   taking the sine of the second reference angle for a second sine result;
   multiplying the second sine result by the radius for a second sine radius result;
   adding the reactance to the second sine radius result to produce a y-axis value for the second point of the circular outer point set,
   where the first reference angle and the second reference angle are different angles and
   where creating the plot employs the x-axis value for the first point of the circular outer point set, the y-axis value for the first point of the circular outer point set, the x-axis value for the second point of the circular outer point set, and the y-axis value for the second point of the circular outer point set.

2. The method of claim 1,
   where the transformation circle is a line transformation circle.

3. The method of claim 1,
   where the transformation circle is a parallel transformation circle.

4. The method of claim 1,
   where the transformation circle is a series transformation circle.

5. A non-transitory computer-readable medium, operatively coupled to a processor, configured to store processor-executable instructions that when executed by the processor, cause the processor to perform a method, the method comprising:
   selecting a center point with an x-axis position based on a resistance of an electrical circuit and a y-axis position based on a reactance of the electrical circuit
   determining a radius from the center point
   choosing an angle difference;
   defining a circular outer point set extended from the center point by the radius by employment of the angle difference;
   producing a plot based, at least in part, on the center point, the radius, and the circular outer point set;
   outputting the plot onto a display, the plot being a transformation circle;
   calculating the x-axis values for the circular outer point set by a first equation:

$r*\cos(\Phi)+R$; and calculating the y-axis values for the circular outer point set by a second equation:

$r*\sin(\Phi)+X$;

where r is a radius from the center point to the outer point set,
   where R is the resistance,
   where X is the reactance, and
   where $\Phi$ is an angle derived from the angle difference.

6. A non-transitory computer-readable medium, operatively coupled to a processor, configured to store processor-executable instructions that when executed by the processor, cause the processor to perform a method, the method comprising:

selecting a center point with an x-axis position based on a resistance of an electrical circuit and a y-axis position based on a reactance of the electrical circuit determining a radius from the center point choosing an angle difference;

defining a circular outer point set extended from the center point by the radius by employment of the angle difference;

producing a plot based, at least in part, on the center point, the radius, and the circular outer point set outputting the plot onto a display, the plot being a transformation circle;

calculating the x-axis values for the circular outer point set by a first equation:

$$\frac{b(1+\tan^2\theta)}{1+\frac{a^2-b^2}{(Z'_o)^2}\tan^2\theta}*\cos(\Phi)+\frac{a(1+\tan^2\theta)}{1+\frac{a^2-b^2}{(Z'_o)^2}\tan^2\theta};$$

and calculating the y-axis values for the circular outer point set by a second equation:

$$\frac{b(1+\tan^2\theta)}{1+\frac{a^2-b^2}{(Z'_o)^2}\tan^2\theta}*\sin(\Phi)+\frac{Z'_o\tan\theta\left(\frac{a^2-b^2}{(Z'_0)^2}-1\right)}{1+\frac{a^2-b^2}{(Z'_o)^2}\tan^2\theta};$$

where a is set by a third equation:

$$\frac{Z_o}{2}\left(\sigma+\frac{1}{\sigma}\right)$$

where b is set by a fourth equation:

$$\frac{Z_o}{2}\left(\sigma-\frac{1}{\sigma}\right)$$

where σ is a standing wave ratio,
where $Z'_o$ is a real impedance element value,
where $Z_o$ is a source impedance element value,
where θ is electrical length,
where R is the resistance,
where X is the reactance,
where Φ is an angle derived from the angle difference, and
where $Z'_o$ is not equal to $Z_o$.

7. A non-transitory computer-readable medium, operatively coupled to a processor, configured to store processor-executable instructions that when executed by the processor, cause the processor to perform a method, the method comprising:

selecting a center point with an x-axis position based on a resistance of an electrical circuit and a y-axis position based on a reactance of the electrical circuit determining a radius from the center point choosing an angle difference;

defining a circular outer point set extended from the center point by the radius by employment of the angle difference;

producing a plot based, at least in part, on the center point, the radius, and the circular outer point set outputting the plot onto a display, the plot being a transformation circle;

calculating the x-axis values for the circular outer point set by a first equation:

$$b*\cos(\Phi)+a; \text{ and}$$

calculating the y-axis values for the circular outer point set by a second equation:

$$b*\sin(\Phi)+Z'_o\tan\theta,$$

where a is set by a third equation:

$$\frac{Z_o}{2}\left(\sigma+\frac{1}{\sigma}\right)$$

where b is set by a fourth equation:

$$\frac{Z_o}{2}\left(\sigma-\frac{1}{\sigma}\right)$$

where σ is a standing wave ratio,
where $Z'_o$ is a real impedance element value,
where $Z_o$ is a source impedance element value,
where θ is electrical length,
where Φ is an angle derived from the angle difference, and
where $Z'_o$ is not equal to $Z_o$.

8. A non-transitory computer-readable medium, operatively coupled to a processor, configured to store processor-executable instructions that when executed by the processor, cause the processor to perform a method, the method comprising:

selecting a center point with an x-axis position based on a resistance of an electrical circuit and a y-axis position based on a reactance of the electrical circuit determining a radius from the center point;

choosing an angle difference;

defining a circular outer point set extended from the center point by the radius by employment of the angle difference;

producing a plot based, at least in part, on the center point, the radius, and the circular outer point set outputting the plot onto a display, the plot being a transformation circle;

calculating the x-axis values for the circular outer point set by a first equation:

$$b*\cos(\Phi)+a; \text{ and}$$

calculating the y-axis values for the circular outer point set by a second equation:

$$b*\sin(\Phi)-Z'_o\cot\theta,$$

where a is set by a third equation:

$$\frac{Z_o}{2}\left(\sigma + \frac{1}{\sigma}\right)$$

where b is set by a fourth equation:

$$\frac{Z_o}{2}\left(\sigma - \frac{1}{\sigma}\right)$$

where σ is a standing wave ratio,
where $Z'_o$ is a real impedance element value,
where $Z_o$ is a source impedance element value,
where θ is electrical length,
where Φ is an angle derived from the angle difference, and
where $Z'_o$ is not equal to $Z_0$.

9. A non-transitory computer-readable medium, operatively coupled to a processor, configured to store processor-executable instructions that when executed by the processor, cause the processor to perform a method, the method comprising:
 selecting a center point with an x-axis position based on a resistance of an electrical circuit and a y-axis position based on a reactance of the electrical circuit determining a radius from the center point;
 choosing an angle difference;
 defining a circular outer point set extended from the center point by the radius by employment of the angle difference;
 producing a plot based, at least in part, on the center point, the radius, and the circular outer point set
 outputting the plot onto a display, the plot being a transformation circle;
 calculating the x-axis values for the circular outer point set by a first equation:

$$\frac{b}{1+\left(\frac{Z_0}{Z'_o \tan\theta}\right)^2} * \cos(\theta) + \frac{a}{1+\left(\frac{Z_0}{Z'_o \tan\theta}\right)^2};$$

and
 calculating the y-axis values for the circular outer point set by a second equation:

$$\frac{b}{1+\left(\frac{Z_0}{Z'_o \tan\theta}\right)^2} * \sin(\theta) + \frac{\frac{Z_0^2}{Z'_o \tan\theta}}{1+\left(\frac{Z_0}{Z'_o \tan\theta}\right)^2};$$

where a is set by a third equation:

$$\frac{Z_o}{2}\left(\sigma + \frac{1}{\sigma}\right)$$

where b is set by a fourth equation:

$$\frac{Z_o}{2}\left(\sigma - \frac{1}{\sigma}\right)$$

where σ is a standing wave ratio,
where $Z'_o$ is a real impedance element value,
where $Z_o$ is a source impedance element value,
where θ is electrical length,
where Φ is an angle derived from the angle difference, and
where $Z'_o$ is not equal to $Z_o$.

10. A non-transitory computer-readable medium, operatively coupled to a processor, configured to store processor-executable instructions that when executed by the processor, cause the processor to perform a method, the method comprising:
 selecting a center point with an x-axis position based on a resistance of an electrical circuit and a y-axis position based on a reactance of the electrical circuit;
 determining a radius from the center point
 choosing an angle difference;
 defining a circular outer point set extended from the center point by the radius by employment of the angle difference;
 producing a plot based, at least in part, on the center point, the radius, and the circular outer point set
 outputting the plot onto a display, the plot being a transformation circle;
 calculating the x-axis values for the circular outer point set by a first equation:

$$\frac{b}{1-\left(\frac{Z_0}{Z'_o \cot\theta}\right)^2} * \cos(\theta) + \frac{a}{1-\left(\frac{Z_0}{Z'_o \cot\theta}\right)^2};$$

and
 calculating the y-axis values for the circular outer point set by a second equation:

$$\frac{b}{1-\left(\frac{Z_0}{Z'_o \cot\theta}\right)^2} * \sin(\theta) - \frac{\frac{Z_0^2}{Z'_o \cot\theta}}{1-\left(\frac{Z_0}{Z'_o \cot\theta}\right)^2};$$

where a is set by a third equation:

$$\frac{Z_o}{2}\left(\sigma + \frac{1}{\sigma}\right)$$

where b is set by a fourth equation:

$$\frac{Z_o}{2}\left(\sigma - \frac{1}{\sigma}\right)$$

where σ is a standing wave ratio,
where $Z'_o$ is a real impedance element value,
where $Z_o$ is a source impedance element value,
where θ is electrical length,
where Φ is an angle derived from the angle difference, and
where $Z'_o$ is not equal to $Z_o$.

* * * * *